(12) United States Patent
Bradley

(10) Patent No.: US 7,019,510 B1
(45) Date of Patent: Mar. 28, 2006

(54) PORTABLE ULTRA WIDE BAND HANDHELD VNA

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 11/011,923

(22) Filed: Dec. 14, 2004

(51) Int. Cl.
*G01R 23/14* (2006.01)
*G01R 27/32* (2006.01)

(52) U.S. Cl. .................... 324/76.23; 324/642
(58) Field of Classification Search ............ 324/76.23, 324/76.19, 76.12, 76.11, 650, 601, 605, 630, 324/638, 646, 76.22, 76.41, 76.43, 76.53, 324/651, 621, 623, 637–642; 702/57, 64, 702/66, 77, 91, 107, 109, 85, 118
See application file for complete search history.

(56) References Cited

U.S. PATENT DOCUMENTS

| | | | | |
|---|---|---|---|---|
| 3,763,431 | A * | 10/1973 | Hopfer | ......................... 324/95 |
| 4,780,661 | A * | 10/1988 | Bolomey et al. | ........... 324/638 |
| 4,808,912 | A * | 2/1989 | Potter et al. | ................ 324/601 |
| 5,642,039 | A | 6/1997 | Bradley et al. | |
| 5,708,377 | A | 1/1998 | Bradley | |
| 5,773,985 | A * | 6/1998 | Bradley | ...................... 324/642 |
| 5,977,779 | A | 11/1999 | Bradley | |
| 6,020,733 | A | 2/2000 | Bradley | |
| 6,147,183 | A | 11/2000 | Hildebrandt et al. | |
| 6,529,844 | B1 * | 3/2003 | Kapetanic et al. | ............ 702/85 |
| 6,714,898 | B1 * | 3/2004 | Kapetanic et al. | .......... 702/191 |
| 6,888,342 | B1 * | 5/2005 | Bradley | ................... 324/76.19 |

* cited by examiner

Primary Examiner—Anjan Deb
Assistant Examiner—Hoai-An D. Nguyen
(74) Attorney, Agent, or Firm—Fliesler Meyer LLP

(57) ABSTRACT

A handheld Vector Network Analyzer (VNA) is provided with circuitry capable of providing operation over a very wide bandwidth. The VNA includes two reflectometers, a first high frequency reflectometer (150) such as the model S331 Site Master™ and a second lower frequency reflectometer (50) such as the model S820 Site Master™, both the S331 and S820 being manufactured by Anritsu Company of Morgan Hill Calif. The high frequency reflectometer (150) includes a forward coupler (109) having a coupling path connected to a high frequency impulse signal source (102), and a through path connecting the test port (3) and incident and reflected signal measurement couplers (110,112) to a load (107). To connect the high and low frequency reflectometers (150,50), a diplexer (170) is connected between the load (107) and an output of the low frequency reflectometer (50). The diplexer (170) includes an inductor (172) for blocking high frequency signals from the low frequency reflectometer (50), and a capacitor (174) preventing a low frequency signal path through the load (107) to ground while providing an impedance matching the load (107) to high frequency signals.

17 Claims, 3 Drawing Sheets

PORTABLE ULTRA WIDE BAND HANDHELD VNA

BACKGROUND

1. Technical Field

The present invention relates to a single port handheld Vector Network Analyzer (VNA) with circuitry capable of providing operation over a very wide bandwidth.

2. Related Art

Handheld VNAs have been available for a number of years, in particular handheld VNAs available include the Site Master™ series manufactured by Anritsu Company of Morgan Hill Calif. Different models of the Site Master™ provide for different frequency operation ranges. For example, the Site Master™ model S331 operates from 25 MHz to 4 GHz, while the model S820 operates from 3.3 GHz to 20 GHz. Both the model S331 and S820 Site Master™ are one port reflectometers used in the evaluation of an antenna and the feed line connecting the antenna to a radio. Unfortunately, a user is forced to purchase two separate units if test frequencies overlap these two models. Inherent fundamental differences exist between the two models disallowing either to cover the frequency band of the other.

The Site Master™ model S331 has a lower frequency operation range and includes components that are similar to those disclosed in U.S. Pat. No. 5,642,039 entitled "Handheld Vector Network Analyzer," which is incorporated herein by reference. U.S. Pat. No. 5,642,039 describes components for generating incident test signals and receiving reflected signals that enable the VNA to be light weight and small sized so that it can be handheld. Components for the Site Master™ model S331 are shown in FIG. 1.

The components of FIG. 1 include an RF source 2 and an LO source 4. One embodiment of components making up the RF source 2 and LO source 4 are described in U.S. Pat. No. 5,642,039, where the RF and LO sources 2 and 4 are interconnected and driven by a single oscillator. The RF source 2 is shown in FIG. 1 to have a 25 MHz to 3.3 GHz range to provide a 25 MHz to 3.3 GHz test signal at test port 3. The LO source 4 is shown as a unipolar impulse response source for driving harmonic samplers 20 and 22. An impulse response source is used along with harmonic samplers to provide a high frequency LO down conversion, although if lower frequency devices are desired a simple non-impulse signal source and mixers can be used as described in U.S. Pat. No. 5,642,039. Internal components of the harmonic samplers 20 and 22 can include step recovery diodes (SRDs) similar to those described in U.S. Pat. No. 5,708,377 entitled "Low Power Dual Sampler Utilizing Step Recovery Diodes (SRDs)," also incorporated herein by reference.

A power splitter 6 divides a signal from an RF signal source 2 into two parts to provide the incident and reflected test signals. A first RF signal component provided from a first output of the splitter 6 is provided through a reflection bridge 8 to form the test signal at test port 3 to a device under test (DUT). A reflected RF signal from the DUT is then received through the reflection bridge 8 and directed to harmonic sampler 20. The reflection bridge 8 allows very low frequency reflected test signals to be provided to the harmonic sampler. The reflection bridge coupler 9 can be formed from a coaxial cable line with a connected ferrite piece to couple signals to appropriate resistors 11–13. A second output of the splitter 6 is provided as the incident RF signal through pad 10 to an input of harmonic sampler mixer 22. The attenuation values for pad 10 and resistors 11–13 of the reflection bridge 8 are chosen to equalize the amplitude of the incident and reflected signals.

By mixing the incident and reflected RF signals originating from splitter 6 in harmonic samplers 20 and 22 with a signal from LO signal source 4, the samplers 20 and 22 provide reflected and incident IF test signals at their outputs. The outputs of mixers 20 and 22 are connected to respective bandpass filters 30 and 32 and amplifiers to remove extraneous signals from the incident and reflected IF signals. The outputs of the bandpass filters 30 and 32 are then provided to the inputs of synchronous detectors or a digital signal processor (DSP) for analyzing the downconverted incident and reflected signals.

The Site Master™ model S820 has a higher frequency operation range and includes components that are similar to those disclosed in U.S. Pat. No. 5,977,779 entitled "Handheld Vector Network Analyzer (VNA) Operating At A High Frequency By Mixing LO and RF Signals Having Offset Odd Harmonics," which is incorporated herein by reference. U.S. Pat. No. 5,977,779 describes components for generating the RF and first and second LO test signals ($LO_1$ and $LO_2$) that enable the VNA to remain lightweight and small sized so that it can be handheld. The components described are illustrated in FIG. 2.

The components of FIG. 2 include an RF source 102 along $LO_1$ and $LO_2$ sources 104 and 105. The RF source 102 provides signals through couplers 109, 110 and 112 to harmonic generators 106 and 108, while the first LO, source 104 provides baseband incident and reflected signals from harmonic generators 106 and 108. Internal components of the harmonic generators can in one embodiment include step recovery diodes (SRDs) as described in U.S. Pat. No. 5,977,779, as well as shown in U.S. Pat. No. 5,708,377, referenced previously. With SRDs in the harmonic generators 106 and 108 having opposing ends connected to the signal path, the signals having even harmonics will be canceled out, and only the odd harmonic signals will provide an output for the harmonic generators. Selection of the appropriate odd harmonics from harmonic generators 106 and 108 enables down conversion to desired output IF frequencies.

To provide a test signal, the output of bipolar source 102 provides the RF signal to a coupling path of the forward coupler 109. A coupling path of the coupler 109 connects to the bipolar source 102. The through path of coupler 109 then connects the termination load 107 to the through path of couplers 110 and 112 to a test port 103. The coupling path of coupler 110 provides a reflected RF signal to a first input of mixer 106. The coupling path of coupler 112 provides an incident RF signal to a first input of mixer 108.

The coupler 109 functions to provide the signal from the bipolar impulse signal source 109 to the test port 126, rather than using a direct connection to the test port 126, to enable a flat power vs. frequency response. The bipolar signal source is used to generate high frequency range signals, such as from 3.3–20 GHz from the test port 103 shown. With higher harmonics and, thus, higher frequency, the output power of the bipolar impulse signal source 102 decreases exponentially, but the response of the coupler 109 provides increasing power with increasing frequency to flatten the frequency vs. power response.

To assure a substantially equal loss is provided by the VNA to the incident and reflected RF signals so that incident and reflected signals can be later compared relative to one another, attenuation pads 120 and 122 are provided between the couplers 110 and 112 and respective mixers 106 and 108.

With mixer 106 mixing the reflected RF signal with a first LO (or baseband) signal from the first LO signal source 104, shown as a square wave source to drive harmonic mixers, an reflected intermediate frequency (IF) signal is provided from mixer 106 to bandpass filter 130. With mixer 110 mixing the incident RF signal with output from first LO signal source 104, a reflected IF signal is provided from mixer 108 to bandpass filter 132. The pass band of filters 130 and 132 are set so that the IF signal will be passed, while remaining harmonics are filtered out.

The output of filter 130 is provided through an amplifier 134 to a first input of mixer 140, while the output of filter 132 is provided through an amplifier 136 to a first input of mixer 142. Second inputs to mixers 140 and 142 are provided from the second LO signal source 105. The outputs of mixers 140 and 142 are provided to synchronous detectors 150 for signal processing to compare the incident and reflected signals and provide a comparison result to a user interface.

Although the Models S331 and S820 shown in FIGS. 1 and 2 separately provide operation over a frequency range of 25 MHz to 20 GHz, it would be desirable for testing some components to provide operation over the entire 25 MHz to 20 GHz frequency range without requiring the purchase of and operation of two separate test devices.

SUMMARY

In accordance with the present invention, a handheld VNA is provided that combines both a low frequency reflectometer and a high frequency reflectometer into a single handheld VNA while maintaining a single test port. The combined low and high frequency reflectometer has circuitry to prevent repeatability and temperature stability issues associated with mechanical or electronic switches that can be used to separately connect the high and low frequency reflectometers in a single text housing to a test port. Costs are reduced from purchasing two separate high and low frequency reflectometers by elimination of a number of duplicate support circuit components. Additionally energy consumption is reduced by the disabling of unused frequency dependant circuitry.

The handheld Vector Network Analyzer (VNA) according to the present invention includes two reflectometers, a first high frequency reflectometer such as the model S820 Site Master™ and a second lower frequency reflectometer such as the model and S331 Site Master™. To connect the high and low frequency reflectometers, a diplexer is connected between the load of the high frequency reflectometer and a test port output of the low frequency reflectometer.

The diplexer functions to pass lower frequency signals from the low frequency reflectometer to the test port while passing the high frequency signals from the higher frequency reflectometer to the load. The diplexer includes an inductor for passing low frequency signals while blocking high frequency signals, and a capacitor preventing a low frequency path through the load to ground while providing an impedance match to the load for high frequency signals.

BRIEF DESCRIPTION OF THE DRAWINGS

Further details of the present invention are explained with the help of the attached drawings in which.

DETAILED DESCRIPTION

Figure 1:
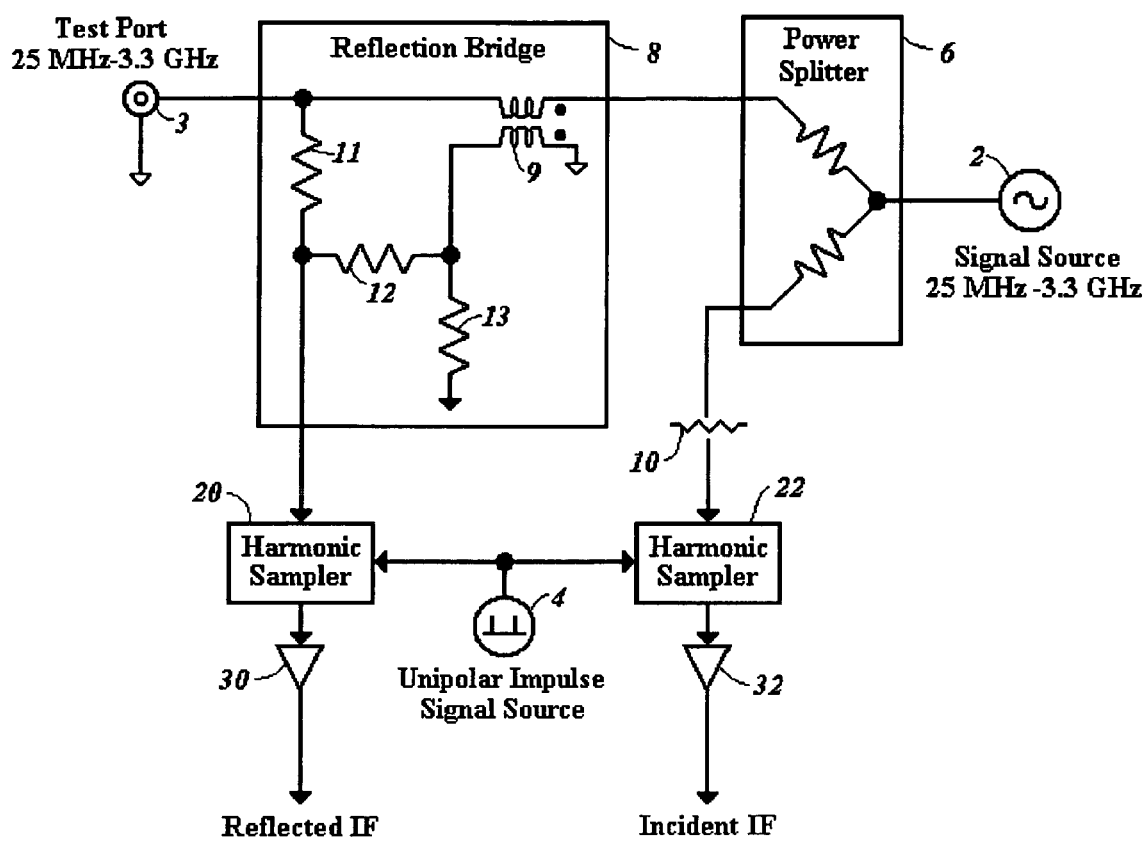
FIG. 1 shows circuitry for a prior art low frequency hand held VNA.
Figure 2:
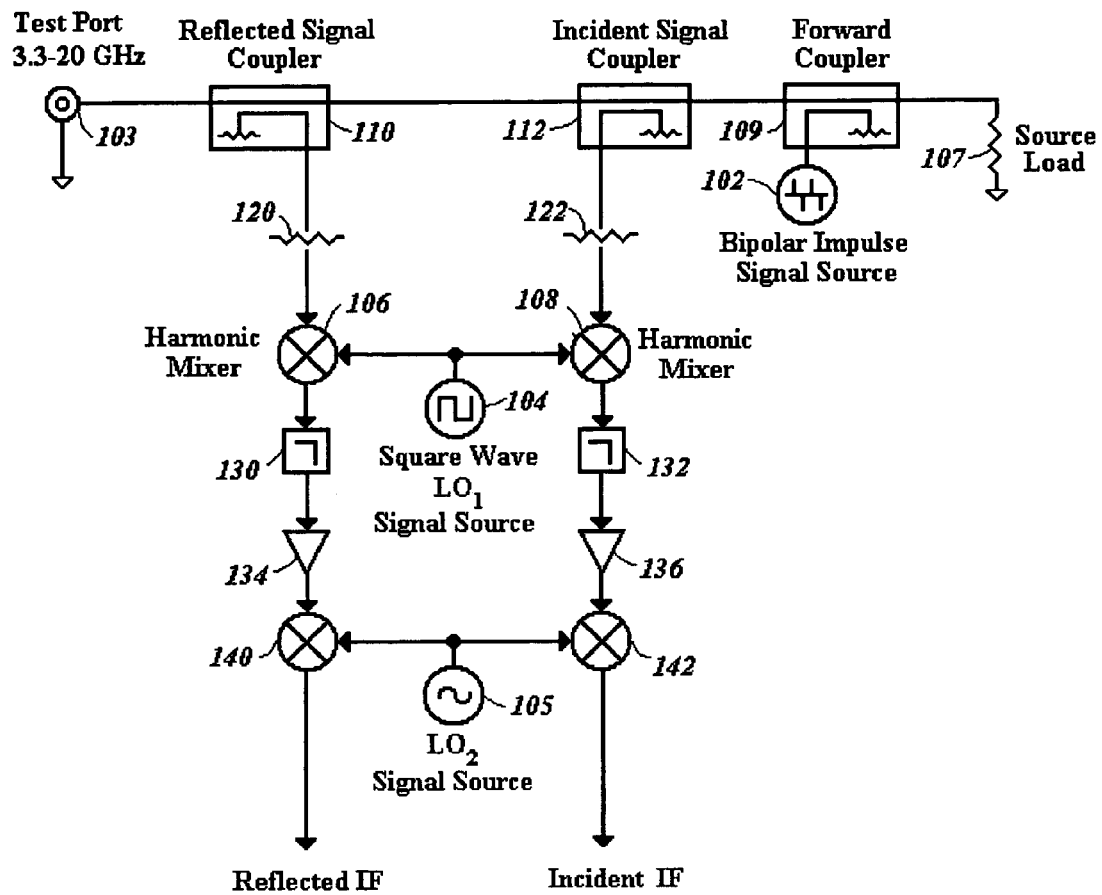
FIG. 2 shows circuitry for a prior art high frequency hand held VNA.
Figure 3:
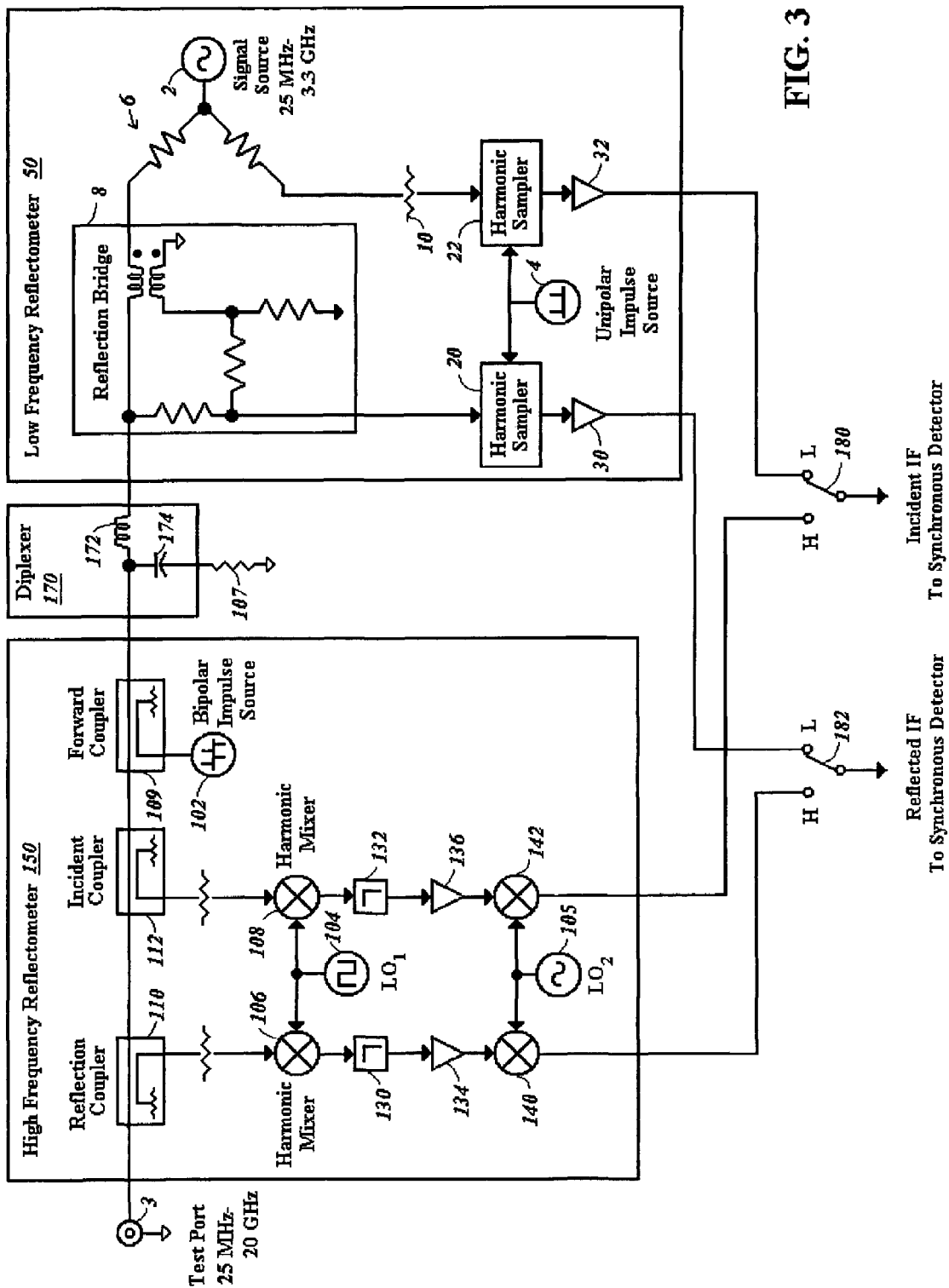
FIG. 3 shows circuitry for a wide bandwidth hand held VNA in accordance with the present invention.

FIG. 3 shows an embodiment of a wide bandwidth hand held VNA in accordance with the present invention. The wide bandwidth VNA shown includes a low frequency reflectometer 50 having components as shown in FIG. 1 and a high frequency reflectometer 150 having components as shown in FIG. 2. A diplexer 170 connects a through port of the forward coupler 109 of the high frequency reflectometer 150 to the load 107 and to the test port of the low frequency reflectometer 50. The diplexer 170 serves to pass low frequency signals from the low frequency reflectometer 50 to test port 3, as well as to prevent a DC path from the low frequency reflectometer 50 to ground through the load 107. Although shown with the specific components, other circuit configurations for the high and low frequency reflectometers can be used. For example, the high frequency reflectometer 150 can be configured to use only one down conversion, the lower frequency reflectometer 50 can be configured to use couplers in place of the reflection bridge and resistive splitter 6 if a very low operation frequency is not desired, and harmonic samplers and impulse sources can be replaced with mixers and non-impulse sources if very high frequencies are not desired. Components carried over from FIGS. 1 and 2 to FIG. 3 are similarly numbered in FIG. 3.

The diplexer 170 includes an inductor 172 connecting the through path of the forward coupler 109 of the high frequency reflectometer 150 to the reflection bridge 8 of the low frequency reflectometer 50. The inductor 172 has a value set to provide a high impedance to signals from the high frequency reflectometer 150 to prevent them from affecting components of the low reflectometer 50. The inductor 172 further allows the low frequency signals (25 MHz–3.3 GHz from source 2) to pass to the test port 3 without significant attenuation. A capacitor 174, then connects the forward coupler 109 to the load 107. The capacitor 174 serves to prevent a DC or low frequency signal (such as a 25 MHz signal from source 2) from having a path to ground through the load 107. The size of the capacitor is set to provide a 50 Ohm load to the high frequency signals of the high frequency reflectometer 150 (3.3–20 GHz signals) to match the 50 Ohm load 107 impedance. The diplexer 170 functions to pass the signals between the low frequency reflectometer 50 and the test port 3, as well as to pass signals from the high frequency reflectometer 150 to the load 107. Although components 172 and 174 are used to provide this diplexer function, other components (e.g. a switch) might likewise be used to provide the same function as would be recognized by a person of ordinary skill in the art. Similarly, although specific frequency operation ranges are shown, namely a range of 25 MHz to 20 GHz, lower frequencies ranging down to DC as well as higher frequencies can be used based on design requirements.

Calibration is used to remove the effect of attenuation created by the inductor 172 and capacitor 174 of the diplexer 170. At the low end of the 3.3–20 GHz frequency range shown for the high frequency reflectometer, signals can experience a 3 dB drop, while minimal drop occurs near 20 GHz due to diplexer 170. Similarly at the high end signals of the 25 MHz–3.3 GHz range, the high frequency signals from reflectometer 50 will experience a 3 dB drop, while minimal drop occurs near 25 MHz. Performing a system calibration will remove the effect of a 3 dB drop due to diplexer 170. As an alternative to diplexer 170 by connecting the test port 3 through a switch to selectively connect the high frequency reflectometer 150 and low frequency reflectometer 50 to the test port 3, a calibration would not typically be repeatable after switching due to changes in the switch, so a new calibration would be required upon switching. Using the diplexer 170 circuitry shown, seamless measurements covering the range of both reflectometers can be made after open-short-load (OSL) Calibration at the test port 3 with no degradation from that of individual instruments.

Switches 180 and 182 are provided to enable connection of one set of the incident 1F and reflected IF signals from the low and high frequency reflectometers 50 and 150 depending on the test signal being measured. The switches 180 and 182 enable the use of a single synchronous detector for processing the IF signals, instead of separate synchronous detectors needed with two separate VNAs. Components for a synchronous detector are described in U.S. Pat. No. 5,642,039, referenced previously. A DSP can be utilized in place of the synchronous detectors, also as indicated in U.S. Pat. No. 5,642,039. To reduce overall power consumption of the combined VNA shown in FIG. 3, the signal source of the reflectometer not being used can be turned off. A controller included in the VNA housing provides for selection of the position of switches 180 and 182, applies power to the signal sources, and allows selection of the frequency of the signal sources. By turning off unused components and eliminating duplicate components, power consumption can be limited to half that needed by two separate reflectometers. Further, cost savings approaches half that of two separate units due to the reassignment of functions to support both technologies.

Although not shown, additional features can be included in a VNA with combined high and low frequency reflectometers. As disclosed in U.S. Pat. No. 5,642,039, referenced previously, the synchronous detectors can include a dither line connected to a reference oscillator driving a signal source, such as either or both or sources 2 and 102, to enable operation of the VNA with minimal interference from external signals. The dither line provides a signal causing the reference oscillator to sweep over a narrow signal range, e.g. a ±600 Hz range, during each measurement interval of the IF signals from mixers 20 and 22 or 140 and 142. A signal provided from an external source at a particular frequency will interfere with only a portion of the signals in the ±600 Hz range, enabling the outputs of the synchronous detectors to be substantially unaffected by the external signal source.

Further components can be included to provide a two port handheld VNA using minimal components in addition to those shown in FIG. 3. Such components are described in U.S. Pat. Nos. 6,020,733 and 6,157,183 both entitled "Two Port Handheld Vector Network Analyzer With Frequency Monitor Mode," and both incorporated by reference herein.

Although the present invention has been described above with particularity, this was merely to teach one of ordinary skill in the art how to make and use the invention. Many additional modifications will fall within the scope of the invention, as that scope is defined by the following claims.

What is claimed is:

1. A vector network analyzer (VNA) comprising:
   a high frequency reflectometer having a first terminal connected to a test port, and a second terminal for connecting to a load;
   a low frequency reflectometer operating at a lower frequency range than the high frequency reflectometer, the low frequency reflectometer having a first terminal for connecting to the test port and a second terminal connected to a low frequency range signal source; and
   a diplexer connecting the first terminal of the low frequency reflectometer to the second terminal of the high frequency reflectometer, wherein said diplexer for blocking high frequency signals from the low frequency reflectometer and preventing a low frequency signal path through the load.

2. The VNA of claim 1, wherein the diplexer comprises:
   an inductor connecting the first terminal of the low frequency reflectometer to the second terminal of the high frequency reflectometer; and
   a capacitor connecting the second terminal of the high frequency reflectometer to ground.

3. The VNA of claim 1, further comprising:
   a means for processing incident and reflected reflectometer signals;
   a first switch having a common terminal for providing an incident signal to the means for processing, a first switching terminal connected to an incident signal output from the high frequency reflectometer, and a second switching terminal connected to an incident signal output from the low frequency reflectometer; and
   a second switch having a common terminal for providing a reflected signal to the means for processing, a first switching terminal connected to a reflected signal output from the high frequency reflectometer; and a second switching terminal connected to a reflected signal output from the low frequency reflectometer.

4. The VNA of claim 3, wherein the means for processing comprises a synchronous detector.

5. The VNA of claim 1, wherein the high frequency reflectometer comprises:
   a forward coupler having a through path with a first terminal forming the second terminal of the high frequency reflectometer for connecting to the load, and a second terminal, and a coupling path for connecting to a high frequency range signal source;
   a reflected signal coupler; and
   an incident signal coupler having a through path connected in series with the reflected signal coupler between the test port and the second terminal of the forward coupler.

6. The VNA of claim 5, wherein the high frequency range signal source is a bipolar impulse response source.

7. The VNA of claim 5, further comprising:
   a first harmonic mixer having a first input connected to the coupling path of the reflected signal coupler;
   a second harmonic mixer having a first input connected to the coupling path of the incident signal coupler;
   a square wave LO source connected to a second input of the first and second harmonic mixers;
   a third mixer having a first input connected by a filter to an output of the first harmonic mixer, a second input connected to the second LO source and having an output providing a reflected IF signal; and
   a fourth mixer having a first input connected by a filter to an output of the second harmonic mixer, a second input connected to the second LO source and having an output providing an incident IF signal.

8. The VNA of claim 1, wherein the low frequency reflectometer comprises:
   a power splitter having an input connected to the low frequency signal source, a first output providing an incident signal reference, and having a second output; and
   a reflection bridge having an input terminal connected to the second output of the power splitter, a first output providing the second terminal of the low frequency reflectometer connected to the diplexer, and a second output providing a reflected signal reference.

9. The VNA of claim 8, wherein the low frequency reflectometer further comprises:
a first harmonic sampler having a first input connected to the second output of the reflection bridge, and having an output providing a reflected IF signal;
a second harmonic sampler having a first input connected to the first output of the power splitter, and having an output providing an incident IF signal; and
a unipolar impulse response source connected to second inputs of the first and second harmonic samplers.

10. A vector network analyzer (VNA) comprising:
a high frequency reflectometer having a first terminal connected to a test port, and a second terminal connected to a forward coupler, the forward coupler having a through port for connecting the test port to a load, and a coupling path connected to a first signal source;
a low frequency reflectometer operating at a higher frequency range that the high frequency reflectometer, the low frequency reflectometer having a first terminal for connecting to the test port and a second terminal connected to a second signal source; and
a means for connecting the first terminal of the low frequency reflectometer to the second terminal of the high frequency reflectometer so that signals from the second signal source are substantially passed from the test port to the low frequency reflectometer and signals from the first signal source are substantially passed from the high frequency reflectometer to the load.

11. The VNA of claim 10, wherein the means for connecting comprises:
an inductor connecting the first terminal of the low frequency reflectometer to the second terminal of the high frequency reflectometer.

12. The VNA of claim 10, wherein the inductor has a value set to substantially block signals from the first signal source, while substantially passing signals from the second signal source.

13. The VNA of claim 10, wherein the means for connecting comprises:
a capacitor connecting the first terminal of the low frequency reflectometer and the second terminal of the high frequency reflectometer to the load.

14. The VNA of claim 10, wherein the capacitor has a value set to prevent coupling of the second signal source to the load, while providing an impedance substantially matching the impedance of the load to the first signal source.

15. A vector network analyzer (VNA) comprising:
a high frequency reflectometer having a first terminal connected to a test port, and a second terminal for connecting to a load;
a low frequency reflectometer operating at a lower frequency range than the high frequency reflectometer, the low frequency reflectometer having a first terminal for connecting to the test port and a second terminal connected to a signal source;
an inductor connecting the first terminal of the low frequency reflectometer to the second terminal of the high frequency reflectometer, wherein said inductor for blocking high frequency signals from the low frequency reflectometer; and
a capacitor connecting the first terminal of the low frequency reflectometer to the load, wherein said capacitor for preventing a low frequency signal path through the load.

16. The VNA of claim 15,
wherein the high frequency reflectometer comprises:
a high frequency range signal source comprising a bipolar impulse response source;
a forward coupler having a through path with a first terminal for connecting to the load, and a second terminal, and a coupling path for connecting to the high frequency range signal source;
a reflected signal coupler;
an incident signal coupler having a through path connected in series with the reflected signal coupler between the test port and the second terminal of the forward coupler;
a first harmonic mixer having a first input connected to the coupling path of the reflected signal coupler;
a second harmonic mixer having a first input connected to the coupling path of the incident signal coupler;
a square wave LO source connected to a second input of the first and second harmonic mixers;
a third mixer having a first input connected by a filter to an output of the first harmonic mixer, a second input connected to the second LO source and having an output providing a first reflected IF signal; and
a fourth mixer having a first input connected by a filter to an output of the second harmonic mixer, a second input connected to the second LO source and having an output providing a first incident IF signal
wherein the low frequency reflectometer comprises:
a power splitter having an input connected to the low frequency signal source, a first output providing an incident signal reference, and having a second output; and
a reflection bridge having an input terminal connected to the second output of the power splitter, a first output providing the second terminal of the low frequency reflectometer connected to the diplexer, and a second output providing a reflected signal reference;
a first harmonic sampler having a first input connected to the second output of the reflection bridge, and having an output providing a second reflected IF signal;
a second harmonic sampler having a first input connected to the first output of the power splitter, and having an output providing a second incident IF signal; and
a unipolar impulse response source connected to second inputs of the first and second harmonic samplers.

17. The VNA of claim 16,
a means for processing incident and reflected reflectometer signals;
a first switch having a common terminal for providing an incident signal to the means for processing, a first switching terminal connected to the output of the fourth mixer to receive the first incident IF signal, and a second switching terminal connected to the output of the second harmonic sampler to receive the second incident IF signal; and
a second switch having a common terminal for providing a reflected signal to the means for processing, a first switching terminal connected to the output of the third mixer to receive the first reflected IF signal, and a second switching terminal connected to the output of the first harmonic sampler to receive the second reflected IF signal.

* * * * *